US006656283B1

United States Patent
Lill

(10) Patent No.: US 6,656,283 B1
(45) Date of Patent: Dec. 2, 2003

(54) CHANNELLED CHAMBER SURFACE FOR A SEMICONDUCTOR SUBSTRATE PROCESSING CHAMBER

(75) Inventor: Thorsten Lill, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 113 days.

(21) Appl. No.: 09/585,710

(22) Filed: May 31, 2000

(51) Int. Cl.[7] .................... C23C 16/00; H05H 1/00
(52) U.S. Cl. ............. 118/715; 118/728; 118/723 I; 156/345.51; 156/345.3; 156/345.29
(58) Field of Search ............ 156/345.29, 345.51, 156/345.48, 345.49, 345.3; 118/728, 715, 723 I; 204/298.31

(56) References Cited

U.S. PATENT DOCUMENTS

| 5,885,356 A | * | 3/1999 | Zhao et al. ............ 118/723 ER |
| 5,891,350 A | * | 4/1999 | Shan et al. .................... 216/71 |
| 5,935,334 A | * | 8/1999 | Fong et al. ........... 118/723 ME |
| 6,027,604 A | * | 2/2000 | Lim et al. ............... 156/345.47 |
| 6,093,281 A | * | 7/2000 | Wise et al. ............. 156/345.29 |
| 6,176,969 B1 | * | 1/2001 | Park et al. ............. 156/345.29 |
| 6,251,216 B1 | * | 6/2001 | Okamura et al. ......... 156/345.1 |
| 6,447,853 B1 | * | 9/2002 | Suzuki et al. ................ 427/585 |

* cited by examiner

*Primary Examiner*—Parviz Hassanzadel
(74) *Attorney, Agent, or Firm*—Moser Patterson & Sheridan; Joseph Bach

(57) ABSTRACT

A method and apparatus for providing particle collection channels in a semiconductor substrate processing chamber. The channels are formed in either a chamber liner or directly into the walls and/or bottom of the chamber. The channels direct trapped particles toward a chamber exhaust port.

9 Claims, 13 Drawing Sheets

CHANNELLED CHAMBER SURFACE FOR A SEMICONDUCTOR SUBSTRATE PROCESSING CHAMBER

BACKGROUND OF THE DISCLOSURE

1. Field of the Invention

The present invention relates generally to semiconductor substrate processing systems and, more particularly, the invention relates to a chamber surface for a semiconductor substrate processing chamber having particle collection channels formed in the surface.

2. Description of the Background Art

In modem fabrication of integrated circuits, features are formed on semiconductor substrates, often silicon wafers, by processing the substrates in enclosed processing chambers, often within a multichamber processing system. Typically, a substrate is robotically introduced into a chamber and secured to a support member, or pedestal, within the chamber. As part of the processing procedure, the processing surface of a substrate may be exposed to gas introduced through a gas inlet and later expelled through a gas outlet, the inlet and outlet being formed in the walls of the chamber.

Various types of processing chambers are used to process semiconductor substrates. In a deposition chamber, layers of material are deposited on the processing surface of a substrate that is secured to a support member. Deposition chambers include physical vapor deposition (PVD) chambers and chemical vapor deposition (CVD) chambers. In PVD chambers, particles are typically sputtered from a target to form layers of material on the processing surface of a substrate. In CVD chambers, introduced gas or gases are used to cause chemical reactions, the product of which deposits on the processing surface of a substrate, forming layers thereon. In an etch chamber, features are formed by chemically removing material from the surface of a substrate by exposing the surface to an etchant gas or gases introduced into and later expelled from the chamber. In a plasma enhanced etch chamber, such as a decoupled plasma source (DPS) etch chamber, a plasma is generated within the chamber above the processing surface of the substrate. During the course of a number of processing steps, plasma generation may be cycled on and off a number of times.

One persistent problem encountered in various types of processing chambers including PVD, CVD and etch chambers is that particles can be generated in the chamber and cause unwanted deposits on various components within the chamber and on the substrate itself. Unwanted particles in the chamber can contaminate the processing surface of a substrate, causing waste and inefficiency.

In plasma enhanced etch chambers, unwanted particle formation within the chamber is practically inevitable. Material removed from the processing surface of the substrate can cause unwanted deposition on surfaces within the chamber before the etchant gas containing the particles can be exhausted. In addition, the plasma can cause chemical reactions and particle film accumulation on surfaces within the chamber, which can eventually crack or flake and generate particles that contaminate the chamber environment and can ultimately deposit on the processing surface of the substrate. When the plasma is cycled off, particles in the chamber environment may settle on surfaces within the chamber, such as the bottom of the chamber, only to be lifted again when gases are flowed into the chamber and the plasma is next cycled on, increasing the chances that the particles will contaminate the processing surface of the wafer.

Avoiding the presence of unwanted particles within the chamber is a difficult problem. Various methods of reducing unwanted particulate contamination and deposition in processing chambers are presently utilized. In etch chambers, unwanted deposition can in some cases be reduced by the use of self-cleaning chemistries. This involves introducing chemical agents, such as fluorine- or chlorine-based compounds, into the chamber that reduce unwanted deposition by reacting with and eliminating the unwanted deposits.

Another approach in reducing the amount of contaminant particles present in the chamber environment involves taking steps to increase adhesion of particles to the chamber walls, thus trapping some of the particulate material so that it cannot contaminate the substrate. This can be accomplished by keeping the chamber walls cool or the surfaces of the walls rough, in order to increase adhesion. This approach has the disadvantage of causing deposits to build up on the walls of the chamber. As these deposits accumulate, thermally induced stresses within the chamber can eventually cause them to crack or flake off, shedding particles that contaminate the chamber environment. Further, causing adhesion of particles to the chamber walls is especially difficult in silicon etch chambers, where the wide and unpredictable variety of particles generated causes difficulty in selecting an ideal type of surface to promote particle adhesion.

Controlling the temperature of the chamber components can sometimes be used to reduce unwanted particulate contamination and deposition within a chamber, depending on the type of chamber and processing circumstances. However, temperature control is at best a partial solution and can be difficult to achieve, particularly considering the difficulty in thermally isolating chamber components during processing steps that require heating the substrate.

Removable chamber liners are sometimes used to remove unwanted depositions within the chamber. However, using liners requires frequently removing and replacing contaminated liners. In addition, accumulation of particles within the chamber between changes of the liner remains a problem.

As discussed above, while various approaches are presently employed to reduce particulate contamination within a chamber and unwanted deposition on the substrate, none of the approaches provide a completely effective solution.

Therefore, there is a need for processing chamber-related equipment that can reduce the amount of particles present in a chamber.

SUMMARY OF THE INVENTION

The present invention generally provides a chamber surface for a semiconductor substrate processing chamber having particle collection channels formed in the surface. Particles in the chamber are trapped in the channels and thereby prevented from contaminating chamber components or a processing substrate.

In one embodiment, the invention provides a liner for the bottom of a plasma etch chamber. Channels formed in the liner lead from an area near a support member to an opening leading to a gas outlet. The channels are sized to prevent plasma from entering the channels and potentially lifting trapped particles out of the channels. Gas flow within the chamber drives particles collected in the channels in the direction of the gas outlet until they are removed through the gas outlet by a vacuum pump. The liner may also have recesses in addition to the channels, to further trap particles and prevent them from contaminating the substrate.

Additionally, secondary channels, or tributaries, may be formed in the liner, each tributary connecting to a channel and radiating outwardly therefrom. Particles trapped in the tributaries are driven by gas flow into the channels, where the particles are further driven to the gas outlet.

In another embodiment, the invention provides a chamber liner having a sidewall, with particle collection channels formed in the sidewall and sized to prevent plasma from entering the channels and potentially removing the particles.

In another embodiment, the invention provides a chamber having a plurality of particle collection channels formed in a chamber bottom. Tributaries and/or recesses may also be formed in the chamber bottom.

In still another embodiment, the invention provides a chamber having a plurality of particle collection channels formed in a chamber sidewall.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The present invention generally provides a chamber surface for a semiconductor substrate processing chamber having particle collection channels formed in the surface. In one embodiment of the invention, the channels are formed in a chamber liner. In another embodiment of the invention, the channels are formed directly in the chamber walls and/or bottom. Particles in the chamber are trapped in the channels and thereby prevented from contaminating chamber components or a substrate being processed. The invention is particularly useful in plasma-assisted etch chambers, where particulate contamination of the chamber environment and ultimately a processing substrate can be especially difficult to prevent. However, other forms of chambers will benefit from use of the invention.

In one embodiment, the channels are sized to prevent plasma from entering therein and lead from an area near a substrate support to an opening in the liner leading to a gas outlet. The sizing of the channels prevents particles contained within the channels from being lifted out by plasma and reintroduced into the chamber environment, where the particles may ultimately contaminate the substrate. Gas flow within the chamber causes particles trapped within the channels to be moved toward and eventually out of the opening in the liner leading to the gas outlet.

Figure 1:
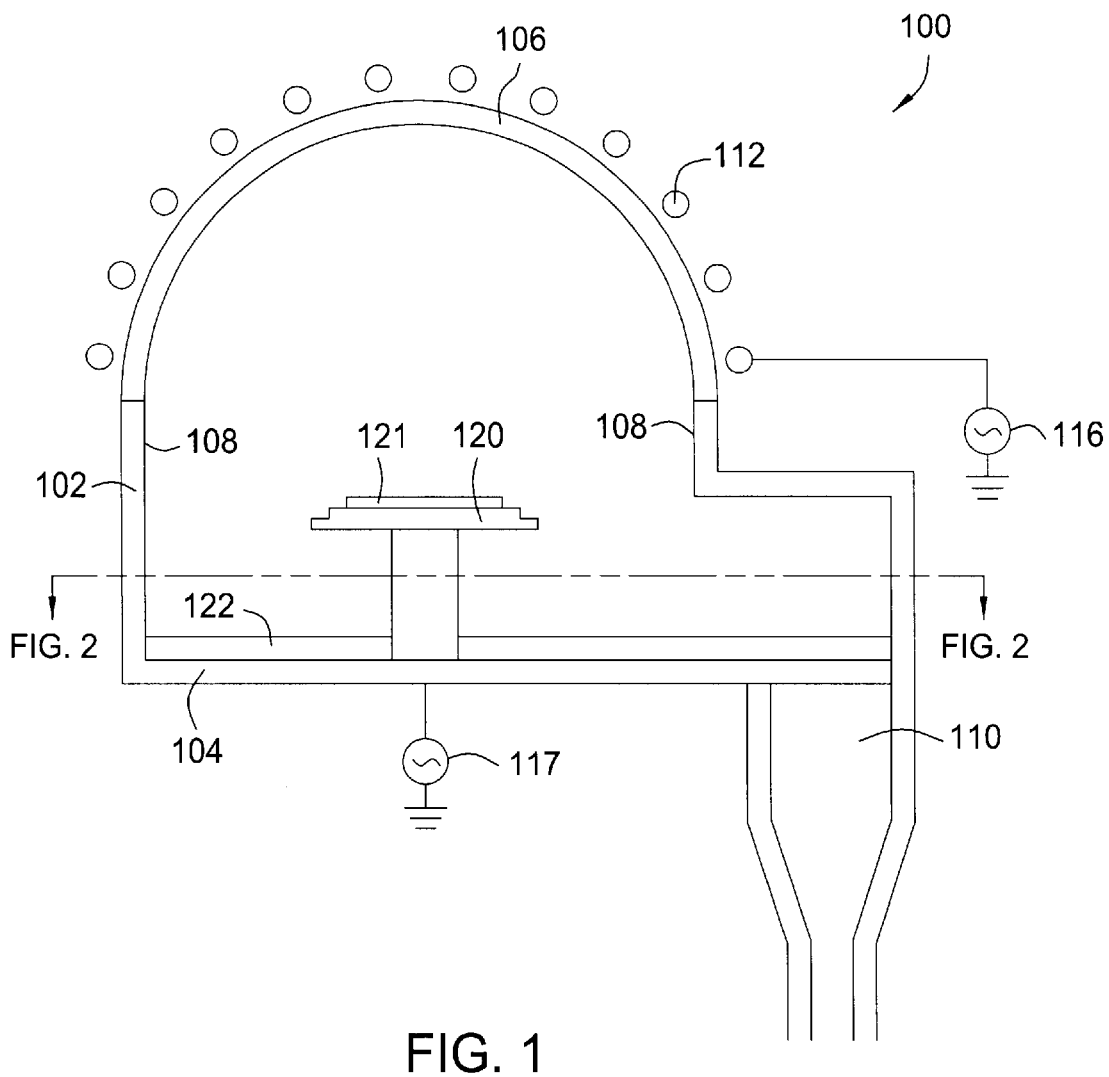
FIG. 1 is a cross-sectional side view of a substrate processing chamber having a liner.

FIG. 1 is a cross-sectional side view of a substrate processing chamber 100 having a liner 122. One embodiment of a substrate processing chamber 100 is a metal etch decoupled plasma source (DPS) chamber, manufactured by Applied Materials, Inc. of Santa Clara, Calif., as depicted in FIG. 1. The invention is discussed in relation to a DPS chamber; however, the invention is useful with respect to any type of substrate processing chamber where particles may cause unwanted deposition within the chamber, including CVD and PVD chambers.

The chamber 100 is defined by a dome 106, a sidewall 102, and a bottom 104. One or more gas inlets 108 (two are shown) are formed in the sidewall 102, and a gas outlet 110 is formed in the bottom 104. Conductive coils 112 circumscribe the outer circumference of the dome 106 and operate as an antenna to couple energy to the gases within the chamber 100. The chamber 100 houses a support member 118 on which a substrate 120 is retained. The support member 118 also functions as a cathode. A high powered RF source 116 powers the conductive coils 112 and an RF or DC source 117 powers the support member 118 functioning as a cathode. A liner 122 is disposed on the bottom 104 of the chamber 100.

In operation, the substrate 120 is placed on the support member 118 and gaseous components are supplied through a gas inlet port or ports 108 and eventually expelled through the gas outlet 110. When plasma is cycled on, plasma is ignited in the process chamber 100 above the processing surface 121 of the substrate 120 by applying RF power from the RF source or sources 116 to both the conductive coils 112 and the support member 118 functioning as a cathode. Plasma may be cycled on and off multiple times during substrate 120 processing. Particles are continually generated in the chamber environment as a result of etching processes performed on the substrate 120 as well as by cracking and flaking of particle film deposits on surfaces within the chamber 100. The liner 122 traps particles that are free in the chamber environment, keeping them from depositing on and contaminating the substrate 120. Gas flow within the chamber 100 drives particles trapped in the liner 122 toward and eventually through the gas outlet 110.

Figure 2:
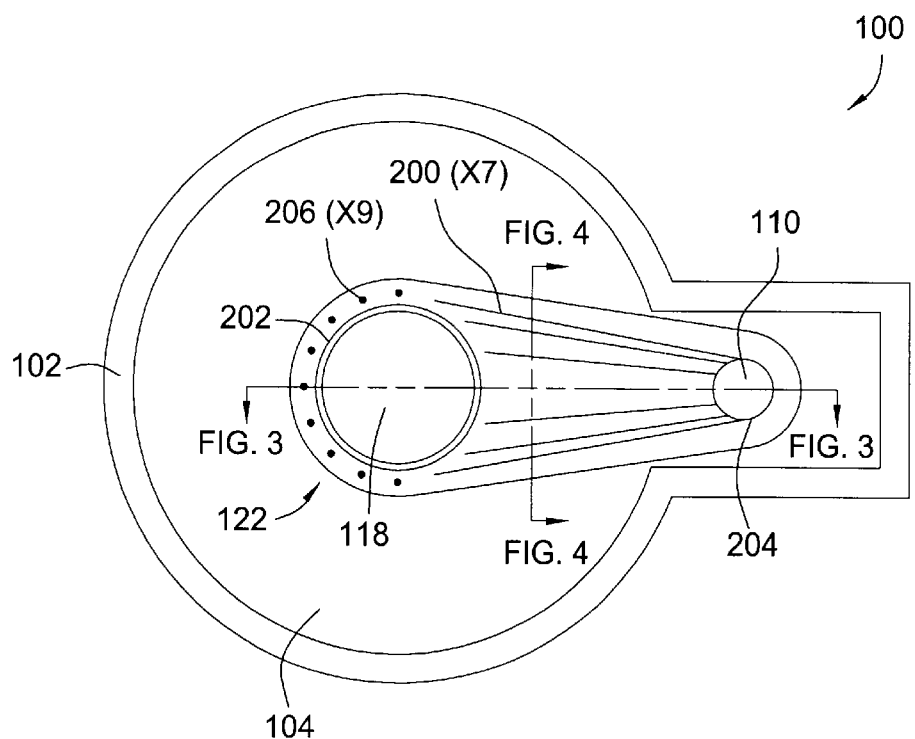
FIG. 2 is a cross-sectional top view of the chamber taken along line 2—2 of FIG. 1.
Figure 3:
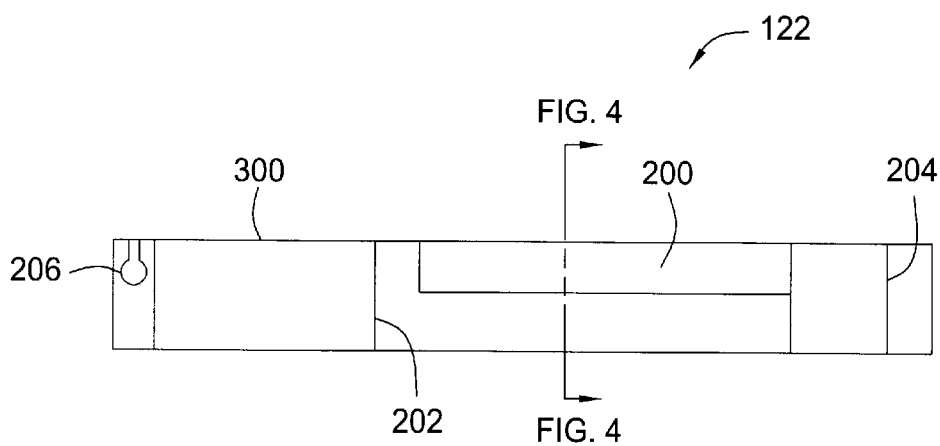
FIG. 3 is a cross-sectional side view of the liner taken along line 3—3 of FIG. 2 depicting a channel and a recess.
Figure 4:
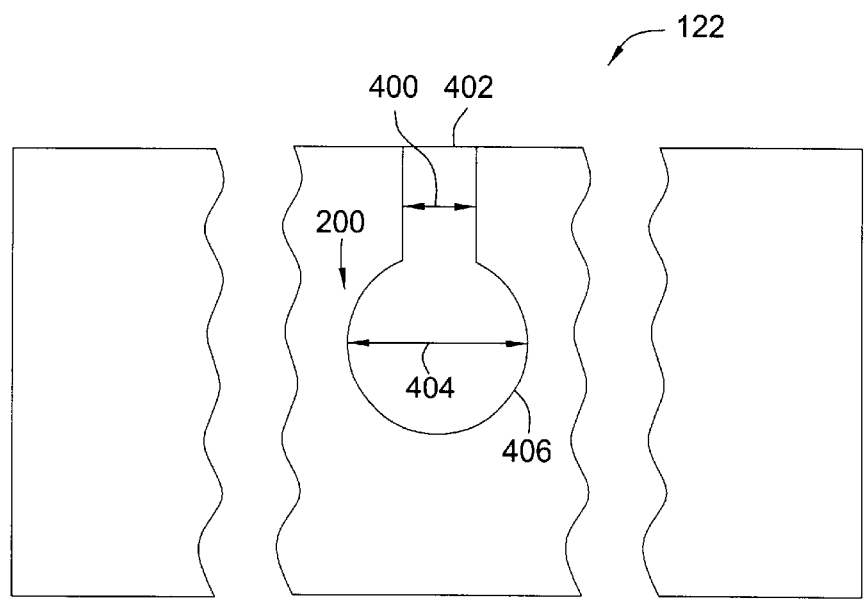
FIG. 4 is a cross-sectional view of the liner taken along line 4—4 of FIGS. 2 and 3 depicting a channel.

To best understand the invention, the reader should simultaneously refer to FIGS. 2, 3, and 4 while reading the following description. FIG. 2 is a cross-sectional top view of the chamber 100 taken along line 2—2 of FIG. 1. In the embodiment shown, the support member 118 extends through a first opening 202 in the liner 122, and a second opening 204 in the liner 122 is positioned over the gas outlet 110. The liner 122 may be made of a corrosion resistant polymeric material including a TEFLON® polymer, ULTEM®, KAPTON®, or VESPEL®. In the embodiment depicted in FIG. 2, the liner 122 has first and second openings 202, 204 formed therein. However, other embodiments of the invention are possible wherein the liner does not have either or both openings.

A plurality of particle collection channels 200 are formed in the liner 122, leading at least partially from the support member 118 to the gas outlet 110. The channels 200 are formed in the liner 122 and extend from the proximity of the first opening 202 until the channels 200 connect to the second opening 204. The first opening 202 is adapted to receive a support member 118 and the second opening 204 is adapted to be positioned above the gas outlet 110.

FIG. 3 is a cross-sectional side view of the liner taken along line 3—3 of FIG. 2. Each channel 200 is formed in the upper surface 300 of the liner 122, extending partly through the liner 122. A channel 200 is shown extending from the proximity of the first opening 202 until the channel 200 connects with the second opening 204.

FIG. 4 is a cross-sectional view of the liner 122 taken along line 4—4 of FIGS. 2 and 3 depicting a channel 200. The width 400 of the mouth 402 of the channel 200 is narrower than the width 404 of the base 406 of the channel 200.

The liner 122 includes a plurality of recesses 206 in addition to the channels 200. The recesses 206 are formed in the liner 122 in the proximity of the portion of the circumference of the first opening 202 that is furthest from the second opening 204. The cross-section of the recesses 206 depicted in FIGS. 2 and 3 is similar to the cross-section of the channel 200 depicted in FIG. 4.

In operation, the channels 200 and recesses 206 trap particles that are free in the chamber environment and thereby prevent the particles from contaminating the substrate 120 and chamber components. Additionally, the dynamics of gas flow within the chamber 100 causes particles trapped in the channels 200 to be moved toward the second opening 204 in the liner 122 and eventually exhausted from the chamber 100 via a vacuum pump (not shown).

In plasma enhanced etch chambers such as the chamber 100 depicted in FIG. 1, plasma formed within the chamber 100 during substrate 120 processing can lift particles from chamber surfaces and into the chamber environment, where the particles may adhere to and contaminate a substrate 120 or chamber components. Typically, plasma may be cycled on and off a number of times during various processing steps. Each time plasma is cycled on, the plasma lifts particles that have accumulated on surfaces of the chamber 100 including the bottom 104 and into the chamber environment, where the particles may deposit on and thus contaminate the substrate 120 or chamber components. In the embodiment depicted in FIGS. 1 through 4, each channel 200 and recess 206 is sized to prevent entry of the plasma therein. As a result, particles that accumulate in the channels 200 and recesses 206 are prevented from being lifted out by plasma, instead remaining trapped in the channels 200 or recesses 206. This prevents the particles from re-entering the chamber environment as the result of plasma cycling and potentially depositing on and contaminating the processing surface 121 of the substrate 120.

The channels 200 and recesses 206 are sized so that, when plasma is cycled on during a processing step, the plasma is prevented from reaching into the channel 200 and contacting surfaces in the channel 200. Plasma has the characteristic that its density dramatically decreases as it approaches a surface. In effect, what is known as a "plasma sheath" is formed in all areas within a certain short distance from all surfaces within the chamber 100, the plasma sheath being an area nearly free of plasma. Each channel 200 and recess 206 is sized so that the width 400 of the mouth 402 is small enough that the surfaces of the liner 122 that form the mouth 402 are near enough to each other so that the plasma sheath proximate to these surfaces causes the entire area enclosed by the mouth 402 to remain nearly free of plasma. For example, the width 400 of the mouth 402 of the channel 200 may be about 1 millimeter. As a result, very little plasma is admitted into the base of the channel 200 or recess 206, so that particles trapped in the base of the channel 200 or recess 206 are prevented from being contacted by the plasma and lifted out of the channel 200 or recess 206 when plasma is cycled on. Particles trapped in the channels 200 are eventually exhausted from the chamber 100 in the manner described above, and particles trapped in the recesses 206 remain there until the liner 122 is cleaned or replaced.

Figure 5:
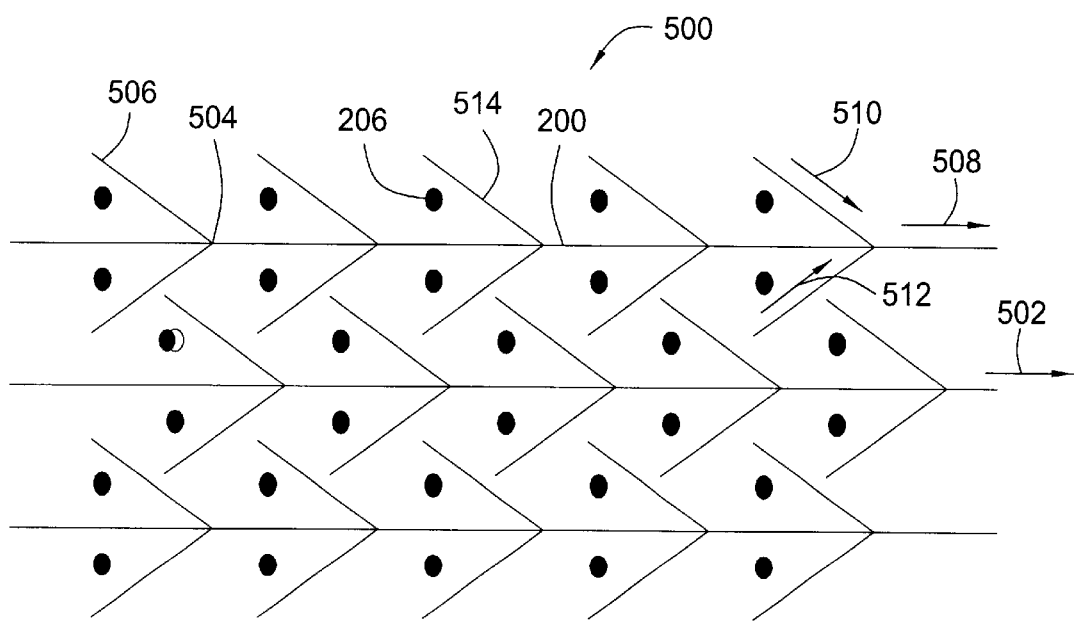
FIG. 5 is a top view of a section of another embodiment of a liner depicting channels, recesses and tributaries.

FIG. 5 is a top view of a section of another embodiment of a liner 500 showing channels 200, recesses 206 and tributaries 514. In this embodiment, the tributaries 514 are identical in cross-section to the channels 200, and are sized to prevent plasma from contacting surfaces therein. Arrow 502 points in the direction of the second opening 204, adapted to be positioned above the gas outlet 110. In the embodiment shown in FIG. 5, a plurality of recesses 206 are formed in the liner 500 and positioned such that a tributary 514 is in a linear path between a recess 206 and the second opening 204 (of FIG. 2).

Each tributary 514 radiates outwardly from a channel 200. Each tributary 514 has a first end 504 connected to a channel 200 and a second end 506 positioned nearer than the first end 504 to the first opening 202 (of FIG. 2). Particles trapped in the channels 200 are moved by gas flow within the chamber through the channel 200 in the direction shown by arrow 508 towards and eventually through the second opening 204. Particles trapped in the tributaries 514 are moved by gas flow within the chamber in the direction of the channel 200 to which the tributary 514 connects, as shown by arrows 510 and 512, until the particles flow from the tributary 514 into the connected channel 200.

Figure 6:
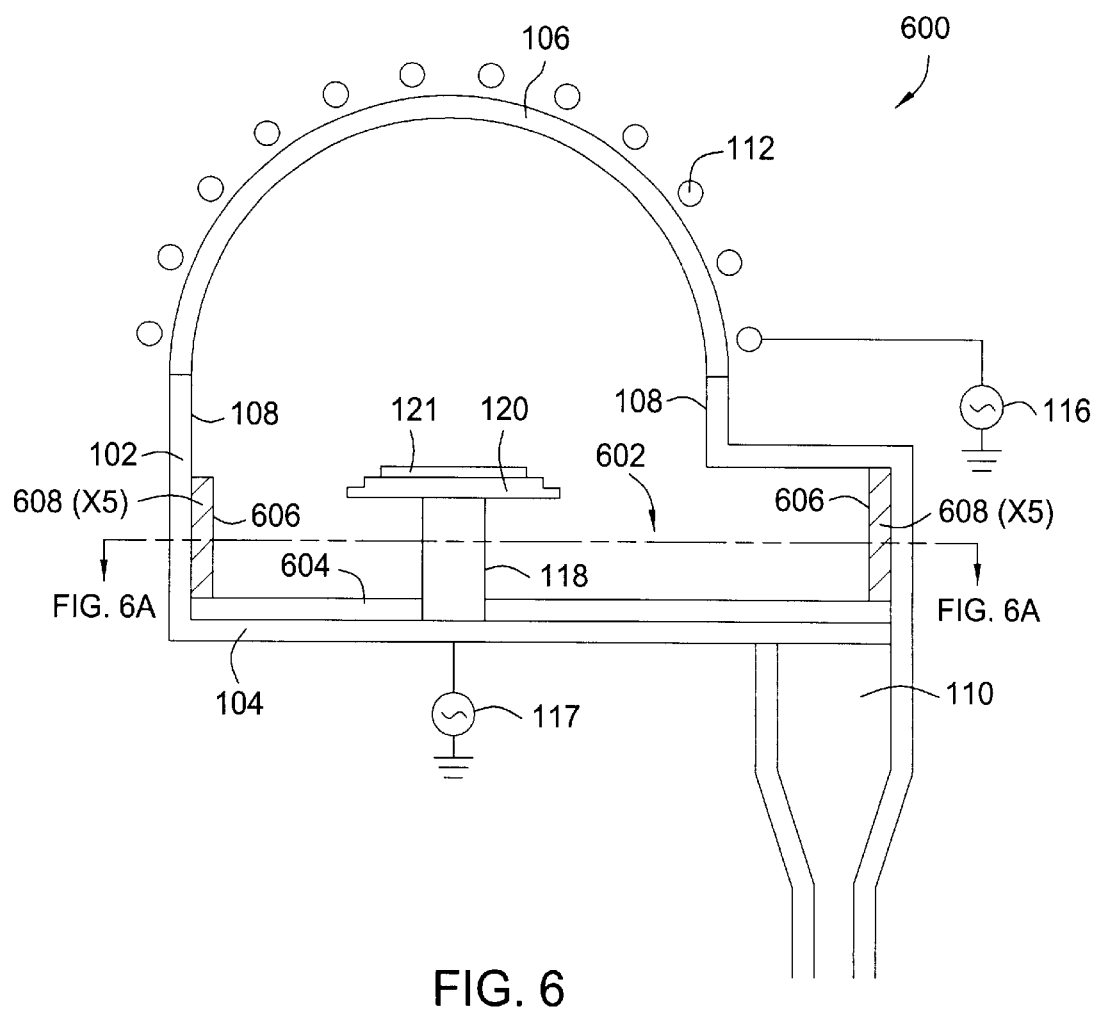
FIG. 6 is a cross-sectional side view of another embodiment of a chamber depicting a liner having a bottom and a sidewall.
Figure 6A:
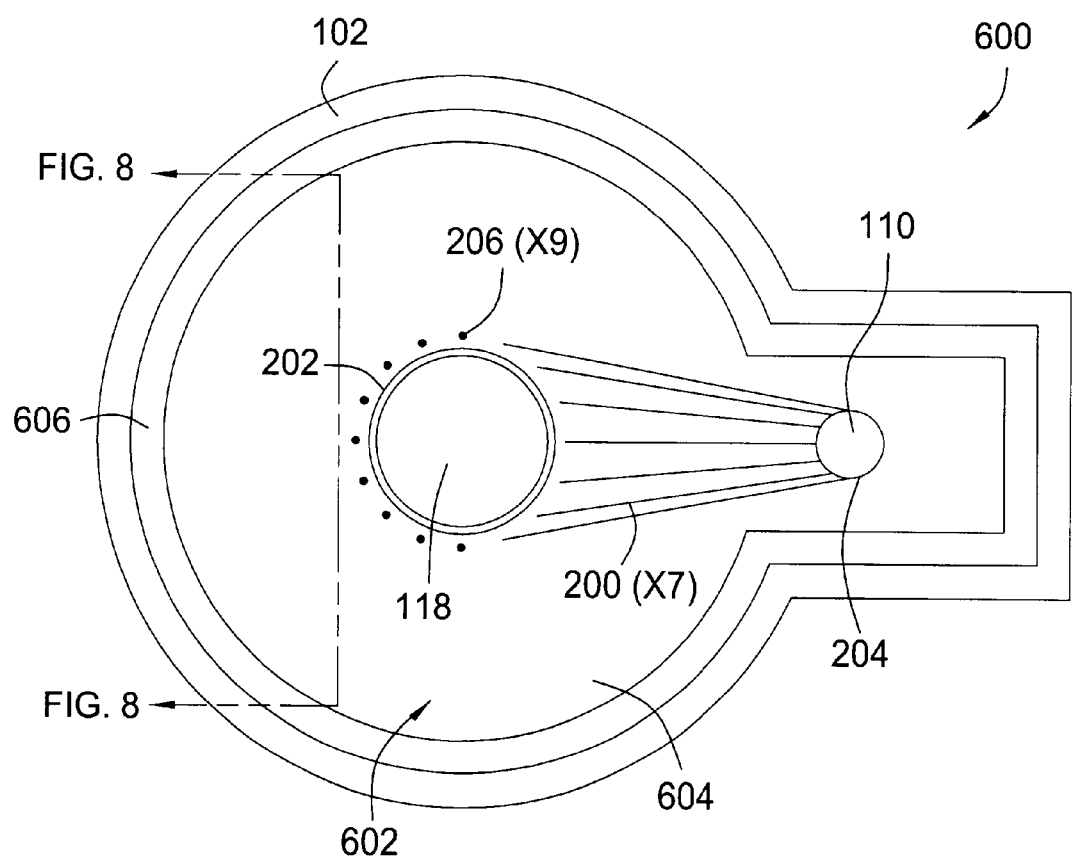
FIG. 6A is a top cross sectional view of the chamber taken along line 6A—6A of FIG. 6.

To best understand the invention, the reader should simultaneously refer to FIGS. 6 and 6A while reading the following description. FIG. 6 is a cross-sectional side view of another embodiment of a chamber 600 having a liner 602 comprising a bottom 604 and a sidewall 606. FIG. 6A is a top view of the liner 602 taken along line 6A—6A of FIG. 6. The liner 602 has a bottom 604 that is adapted to be positioned along the bottom 104 of the chamber 600 and a sidewall 606 that is adapted to be positioned along the sidewall 102 of the chamber 600. The bottom 604 and the sidewall 606 of the liner 602 may be separate or may be a unitary structure. In this embodiment, the bottom 604 of the liner 602 covers substantially all of the chamber bottom 104 (of FIG. 6) and the sidewall 606 of the liner 602 is disposed along the circumference of the chamber bottom 604. The sidewall 606 of the liner 602 extends completely around the sidewall 102 of the chamber 600.

Figure 6B:
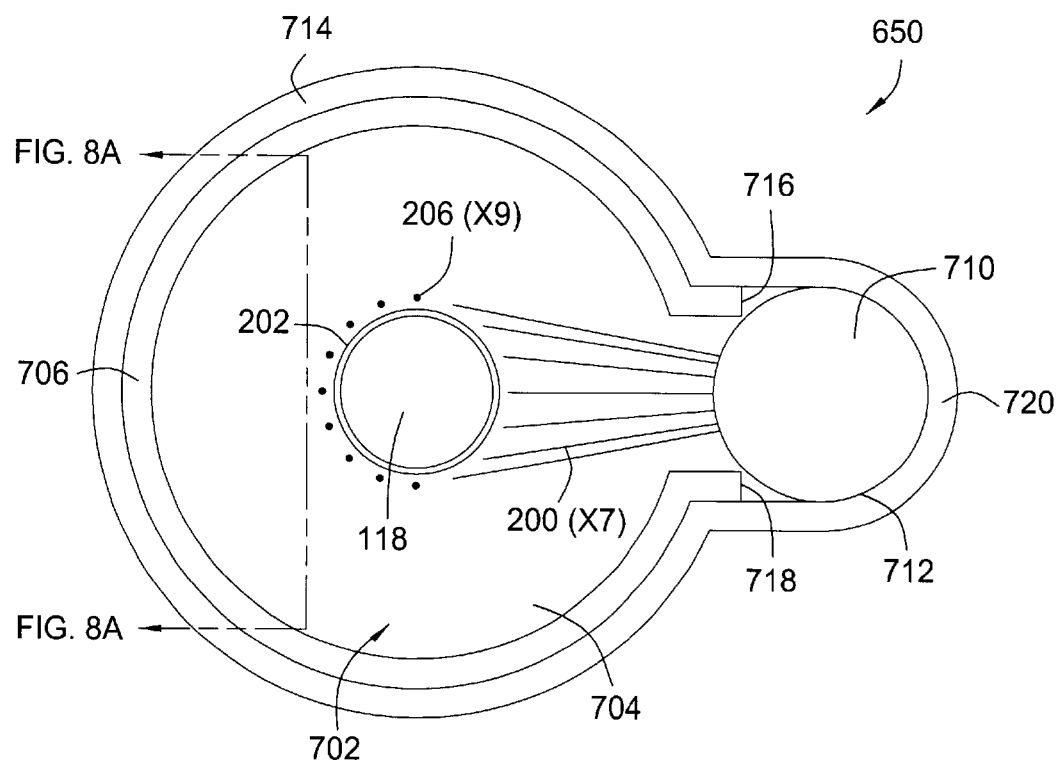
FIG. 6B is a top cross sectional view of another embodiment of a chamber.

FIG. 6B shows a top view of another embodiment of a chamber 650 having a liner 706 comprising a bottom 704 and a sidewall 706. The sidewall 714 of the chamber 650 is curved in the vicinity of the gas outlet 710. A portion of the circumference of the gas outlet 710 defines a curved portion 720 of the sidewall 714 of the chamber 650. The sidewall 706 extends around the chamber 650 up to the vicinity of the gas outlet 710. The liner has a first end 716 and a second end 718, both positioned in the vicinity of the gas outlet.

Figure 7:
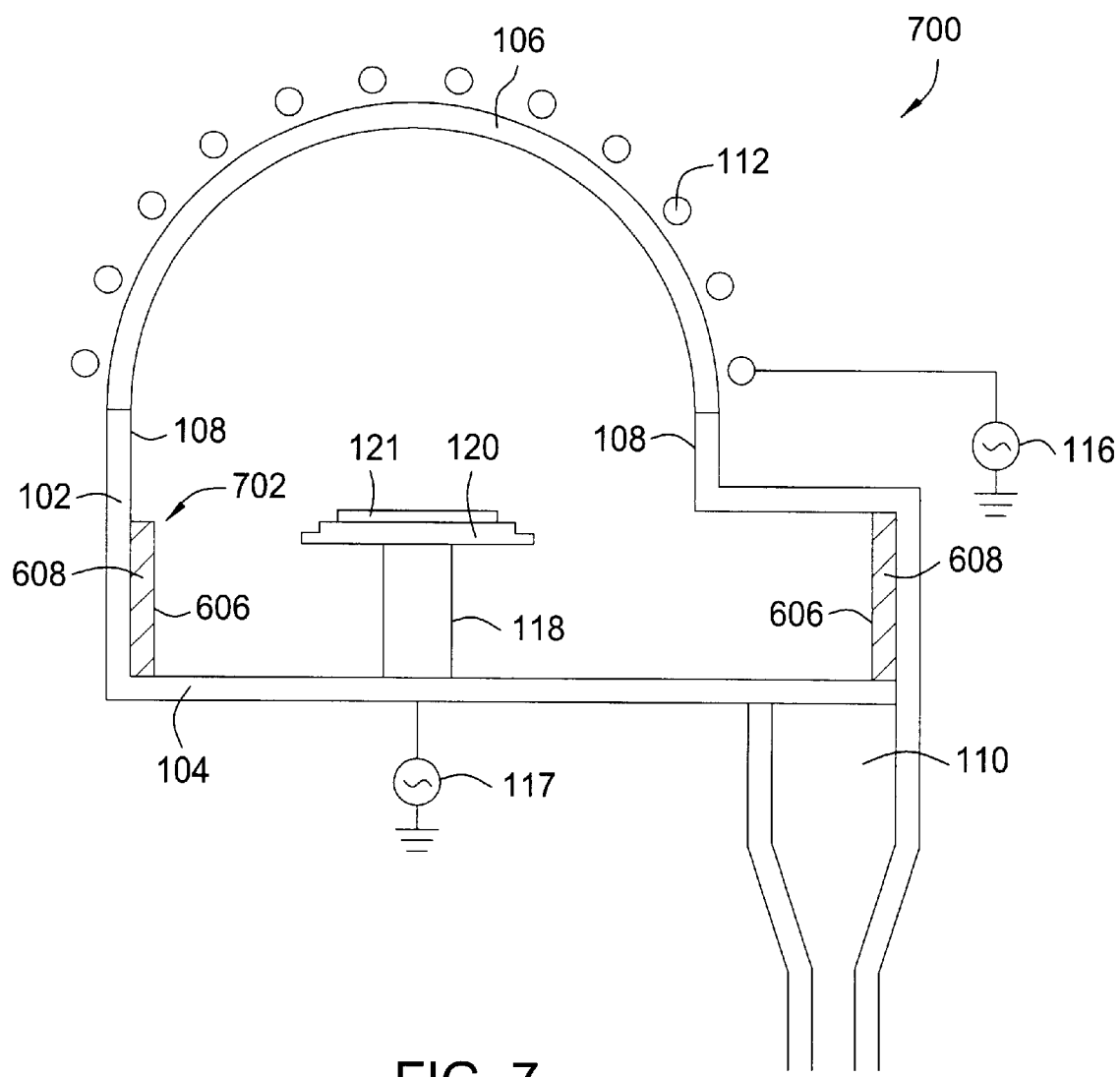
FIG. 7 is a cross-sectional side view of another embodiment of a chamber depicting a liner having a sidewall.

FIG. 7 is a cross-sectional side view of another embodiment of a chamber 700 depicting a liner 702 consisting of the sidewall 606 positioned along the chamber 700 sidewall 102. The liner 702 depicted in FIG. 7 has no bottom.

A plurality of particle collection grooves 608 (five are shown) are formed in the sidewall 606 of the liners depicted in FIGS. 6, 6A, 6B and 7. The grooves 608 are vertically spaced from one another and extend horizontally along the sidewall 606. The grooves 608 are sized to prevent plasma from contacting surfaces therein.

Figure 8:
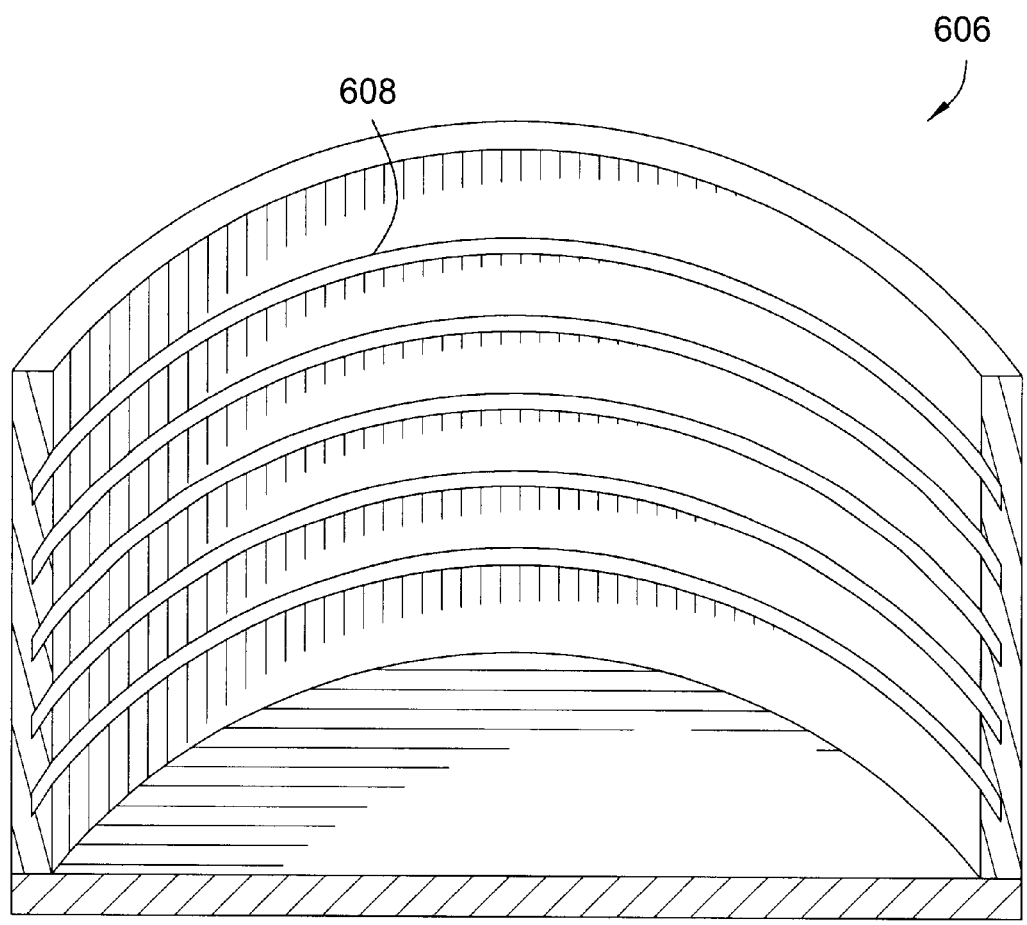
FIG. 8 is a sectional perspective view of the sidewall of the liner taken along line 8—8 of FIG. 6A depicting grooves.

FIG. 8 is a sectional perspective view of the sidewall of the liner taken along line 8—8 of FIG. 6A depicting grooves. In the embodiment depicted in FIG. 8, each groove 608 is formed at a different vertical height on sidewall 606 of the liner and extends horizontally along the sidewall 606 of the liner.

Figure 8A:
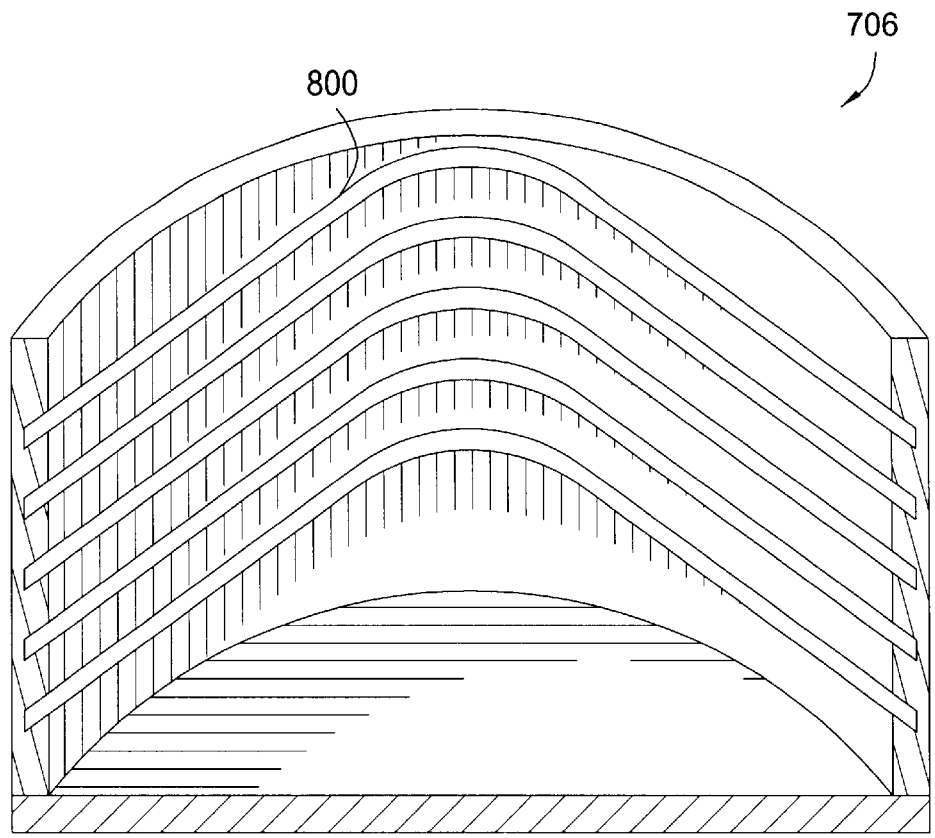
FIG. 8A is a sectional perspective view of the sidewall of the liner taken along line 8A—8A of FIG. 6B depicting grooves.

FIG. 8A is a sectional perspective view of the sidewall of the liner taken along line 8A—8A of FIG. 6B depicting grooves. In the embodiment depicted in FIG. 8A, the grooves 800 slope slightly downward as the grooves 800 approach the first end 716 end and the second end 718 of the sidewall 706 of the liner 702 in the vicinity of the gas outlet 710 (shown in FIG. 6B), so that gravity and/or gas flow dynamics within the chamber cause at least a portion of particles trapped in the grooves 800 to eventually reach an end of the grooves 800 at the first end 716 or the second end 718 of the sidewall 706 of the liner 702 and fall into the gas outlet 710.

Figure 9:
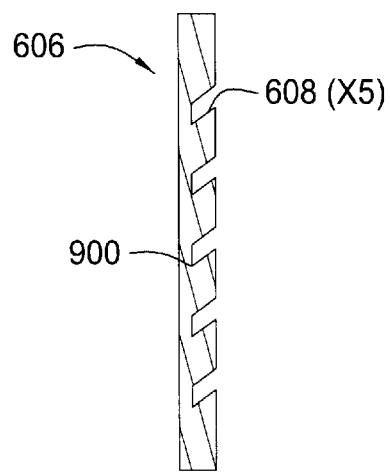
FIG. 9 is a cross-sectional side view of the sidewall of the liners of FIGS. 6, 6A, and 7 depicting grooves.

FIG. 9 is a cross-sectional side view of a sidewall 606 of the liners of FIGS. 6 and 7. In the embodiment depicted in FIG. 9, the sidewall 606 is cylindrically shaped. The grooves 608 extend at a downward angle into the sidewall 606 of the liner. Gravity causes particles that happen to enter into a groove 608 to fall to the bottom 900 of the groove 608. Each groove 608 is sized to prevent plasma from entering into the groove 608 and contacting surfaces therein, so that particles at the bottom 900 of the groove 608 are trapped there and cannot re-enter the chamber environment and potentially deposit on and contaminate the substrate 120 or chamber components.

Figure 10:
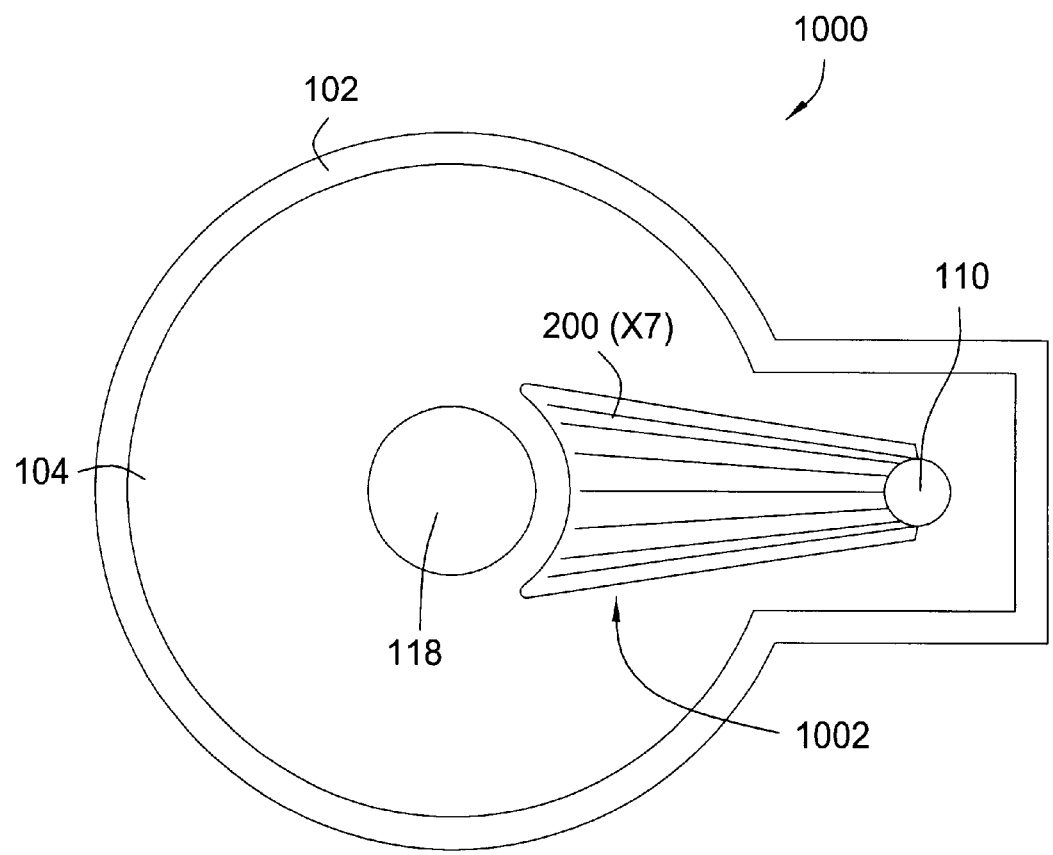
FIG. 10 is a top view of another embodiment of a liner.

FIG. 10 is a top view of another embodiment of the invention depicting a liner 1002 positioned in a chamber 1000. The liner 1002 is disposed on the chamber bottom 104 between the support member 118 and the gas outlet 110 so as to extend from the proximity of the support member 118 to the gas outlet 110. The liner extends only partly around the support member 118 and the gas outlet 110, and no openings are formed in the liner 1002. Particle collection channels 200 formed in the liner 1002 extend from the proximity of the support member 118 to the gas outlet 110.

Figure 11:
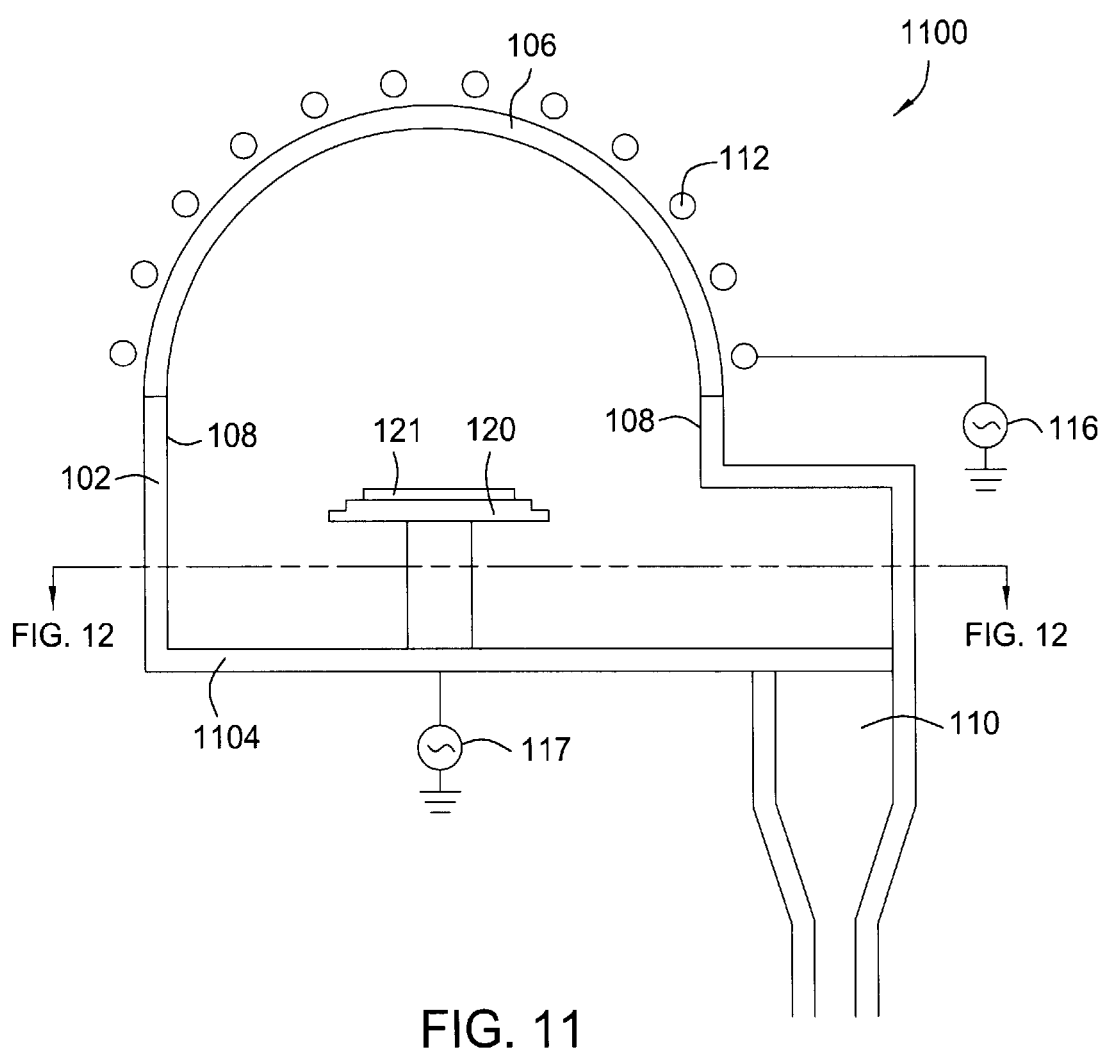
FIG. 11 is a cross-sectional side view of another embodiment of a substrate processing chamber.
Figure 12:
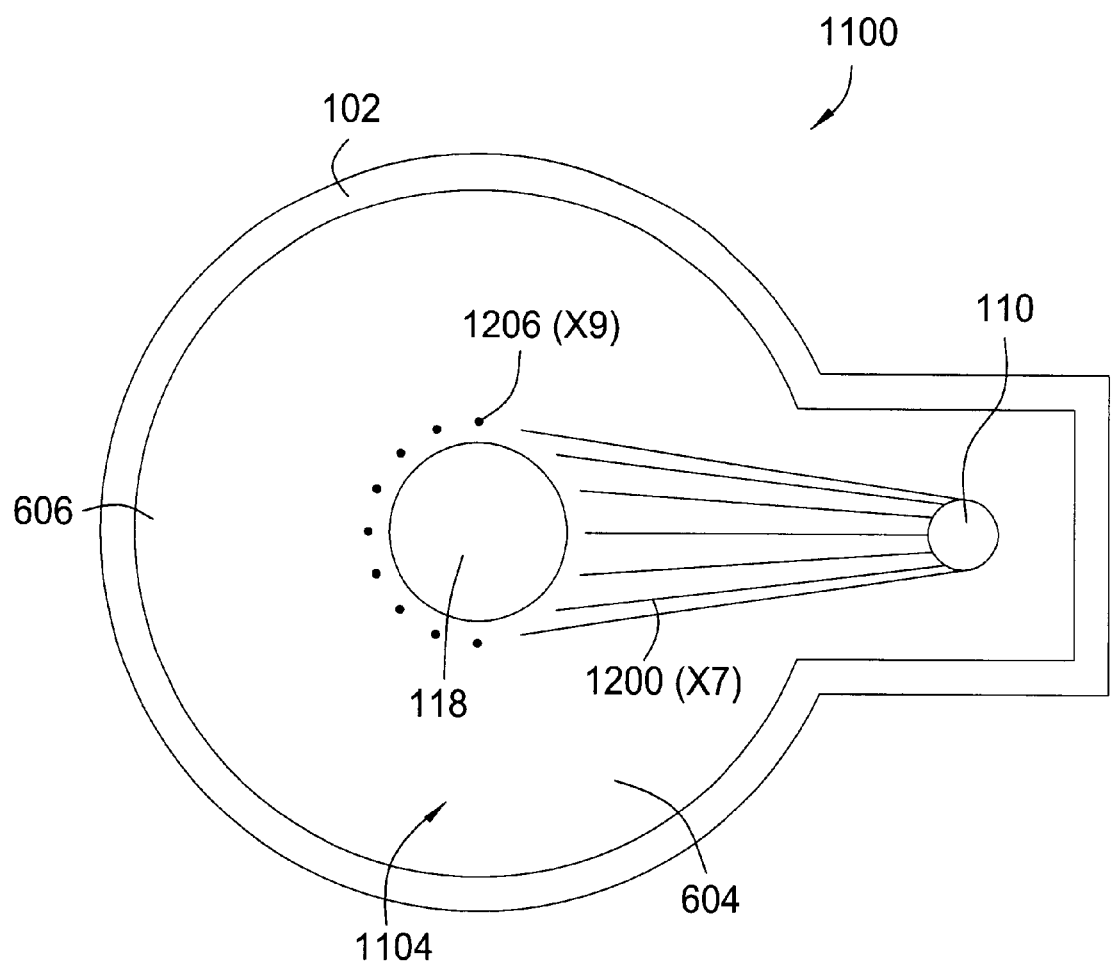
FIG. 12 is a cross-sectional top view of the chamber taken along line 12—12 of FIG. 1.

To best understand the invention, the reader should refer simultaneously to FIGS. 11 and 12 while reading the following description. FIG. 11 is a cross-sectional side view of another embodiment of embodiment of the invention, depicting a chamber 1100 without a liner. FIG. 12 is a cross-sectional top view of the chamber 1100 of FIG. 11 taken along line 12—12 of FIG. 11. As shown in FIG. 12, a plurality of particle collection channels 1200 and recesses 1206 are formed in the chamber bottom 1104. The particle collection channels 1200 and recesses 1206 formed in the chamber bottom 1104 are similar to and function similarly to the particle collection channels 200 and recesses 206 formed in chamber liner 122, as described above with reference to FIGS. 2, 3, and 4.

In another embodiment of the chamber, a chamber bottom may have recesses 1206 and/or tributaries in addition to the particle collection channels 1200 and the recesses 1206 depicted in FIG. 11 that are similar to and function similarly to the recesses 206 and tributaries 514 of the chamber liner 500 depicted and described with reference to FIG. 5.

Figure 13:
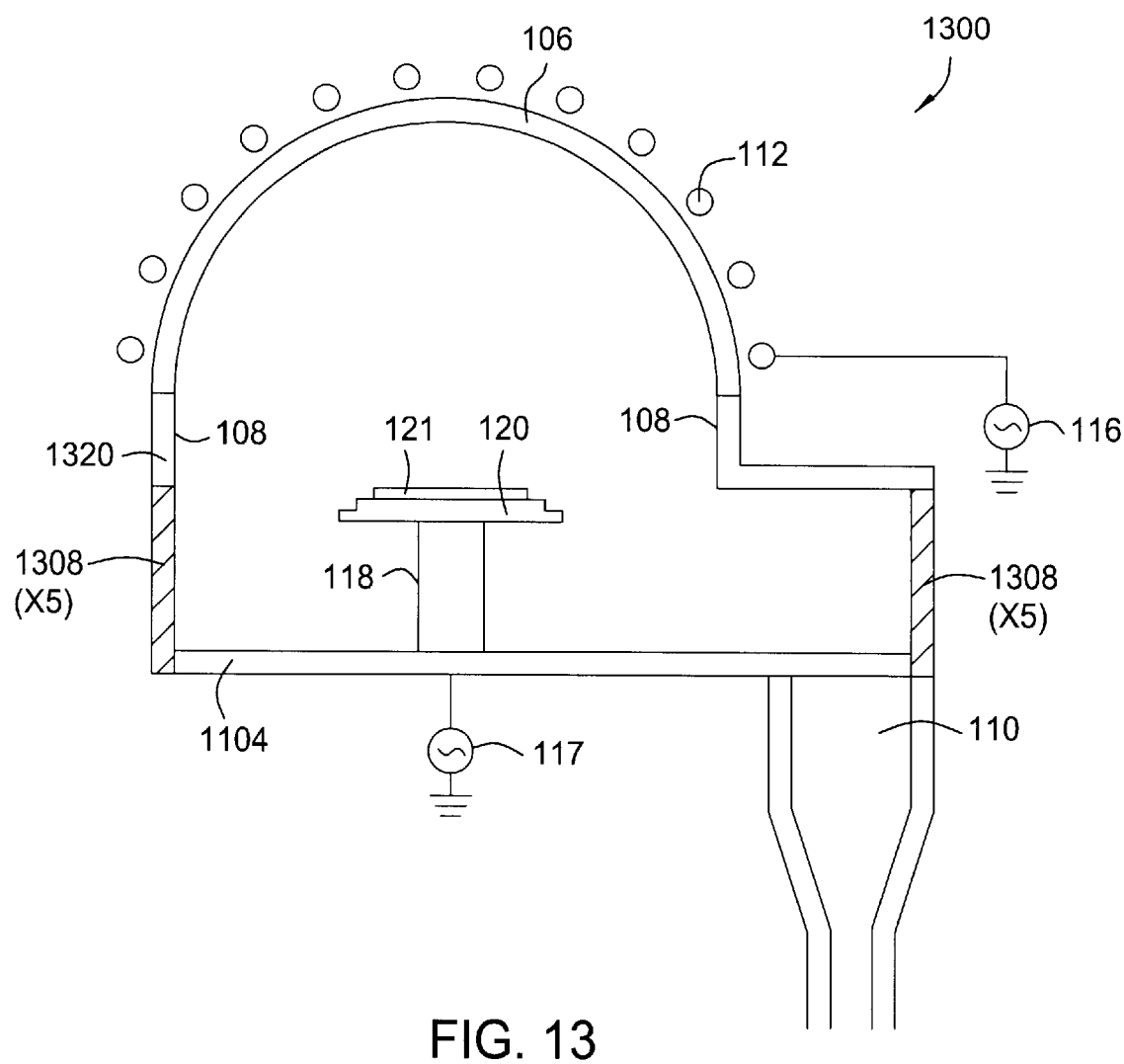
FIG. 13 is a cross-sectional side view of another embodiment of a chamber.

FIG. 13 is a cross-sectional side view of another embodiment of a chamber 1300. In the embodiment depicted in FIG. 13, the chamber 1300 has a chamber sidewall 1320 having a plurality of particle collection grooves 1308 formed in the chamber sidewall 1320, in addition to having a chamber bottom 1104 having a plurality of particle collection channels 1200 and recesses 1206 are formed in the chamber bottom 1104. The particle collection grooves 1308 formed in the chamber sidewall 1320 are similar to and function similarly to particle collection grooves 608 formed in sidewall 606 of liner 602, depicted and described with reference to FIG. 6. In an alternative embodiment, a chamber (not shown) may have a chamber sidewall 1320 having a plurality of particle collection grooves 1308 formed in the chamber sidewall 1320, and a chamber bottom that does not have a plurality of particle collection channels 1200 and/or recesses 1206 formed in the chamber bottom.

While foregoing is directed to the preferred embodiment of the present invention, other and further embodiments of the invention may be devised without departing from the basic scope thereof, and the scope thereof is determined by the claims that follow.

What is claimed is:

1. An apparatus for use in a semiconductor substrate processing chamber, comprising:

a chamber liner disposed at least partially on a bottom of the chamber, the chamber liner having a plurality of particle collection grooves; and the chamber liner has a first opening and a second opening, and wherein the first opening is adapted to receive a substrate support member therethrough and the second opening leads to an exhaust port, wherein each of the particle collection grooves extend from a location proximate the first opening to the second opening.

2. The apparatus of claim 1, wherein each of the particle collection grooves in the plurality of particle collection grooves is sized to prevent plasma from contacting surfaces therein.

3. The apparatus of claim 2, wherein each of the particle collection grooves in the plurality of particle collection grooves has a base having a width and a mouth having a width, and wherein the width of the base is wider than the width of the mouth.

4. The apparatus of claim 1, further comprising a first plurality of recesses formed in the chamber liner, wherein the first plurality of recesses are disposed substantially around the first opening, and wherein each recess of the first plurality is sized to prevent plasma from contacting surfaces therein.

5. The apparatus of claim 1, wherein the chamber liner is made of a corrosion resistant polymeric material.

6. A semiconductor substrate processing chamber, comprising:

an enclosure having an exhaust port; and a chamber liner disposed at least partially on a bottom of the chamber in the enclosure, the chamber liner having a plurality of particle collection grooves that lead to the exhaust port;

the chamber liner having a first opening and a second opening, wherein the first opening is adapted to receive a substrate support member therethrough; and the second opening leads to the e port.

7. The apparatus of claim 6, wherein each of the particle collection grooves in the plurality of particle collection grooves is sized to prevent plasma from contacting surfaces of the particle collection grooves.

8. The apparatus of claim 7, wherein each of the particle collection grooves in plurality of particle collection grooves has a base having a width and a mouth having a width, and wherein the width of the base is wider than the width of the mouth.

9. The apparatus of claim 6, wherein the chamber liner is made of a corrosion resistant polymeric material.

* * * * *

UNITED STATES PATENT AND TRADEMARK OFFICE
CERTIFICATE OF CORRECTION

PATENT NO. : 6,656,283 B1
DATED : December 2, 2003
INVENTOR(S) : Lill

It is certified that error appears in the above-identified patent and that said Letters Patent is hereby corrected as shown below:

Column 1,
Line 14, please change "modem" to -- modern --.

Column 8,
Line 67, please change "e port" to -- exhaust port --.

Signed and Sealed this

Twenty-second Day of June, 2004

JON W. DUDAS
*Acting Director of the United States Patent and Trademark Office*